United States Patent [19]

Coia

[11] 3,996,453
[45] Dec. 7, 1976

[54] TOTALIZER

[75] Inventor: Pasco A. Coia, Providence, R.I.

[73] Assignee: General Signal Corporation, New York, N.Y.

[22] Filed: May 8, 1975

[21] Appl. No.: 575,781

[52] U.S. Cl. .................. 235/150.51; 235/92 DM; 235/150.3; 340/347 AD
[51] Int. Cl.² ..................................... G06G 7/18
[58] Field of Search ...... 235/150.51, 150.3, 92 CC, 235/92 FQ, 92 TF, 92 PL, 92 DM; 340/347 AD; 73/230

[56] References Cited
UNITED STATES PATENTS

| | | | |
|---|---|---|---|
| 3,014,659 | 12/1961 | Dickinson | 235/150.3 |
| 3,063,635 | 11/1962 | Gordon | 235/150.51 |
| 3,313,924 | 4/1967 | Schulz et al. | 235/150.51 |
| 3,550,018 | 12/1970 | James et al. | 235/150.51 |

Primary Examiner—Malcolm A. Morrison
Assistant Examiner—Errol A. Krass
Attorney, Agent, or Firm—Barlow & Barlow

[57] ABSTRACT

A totalizer is provided which is adapted to accept a variety of process signals at the input thereof, which process signals will be in analog form. The signals are then first converted into digital form by first converting all of the types of input signals to a voltage signal that is proportional to the value of the input signal and then converting this voltage signal to a series of pulses whose repetition rate is proportional to the voltage input and then counting these pulses on a decade counter which is provided with a decimal decoder through which a scale factor may be introduced into the counter. The output of the initial decade counter is then fed into a memory bank having a visual readout.

4 Claims, 1 Drawing Figure

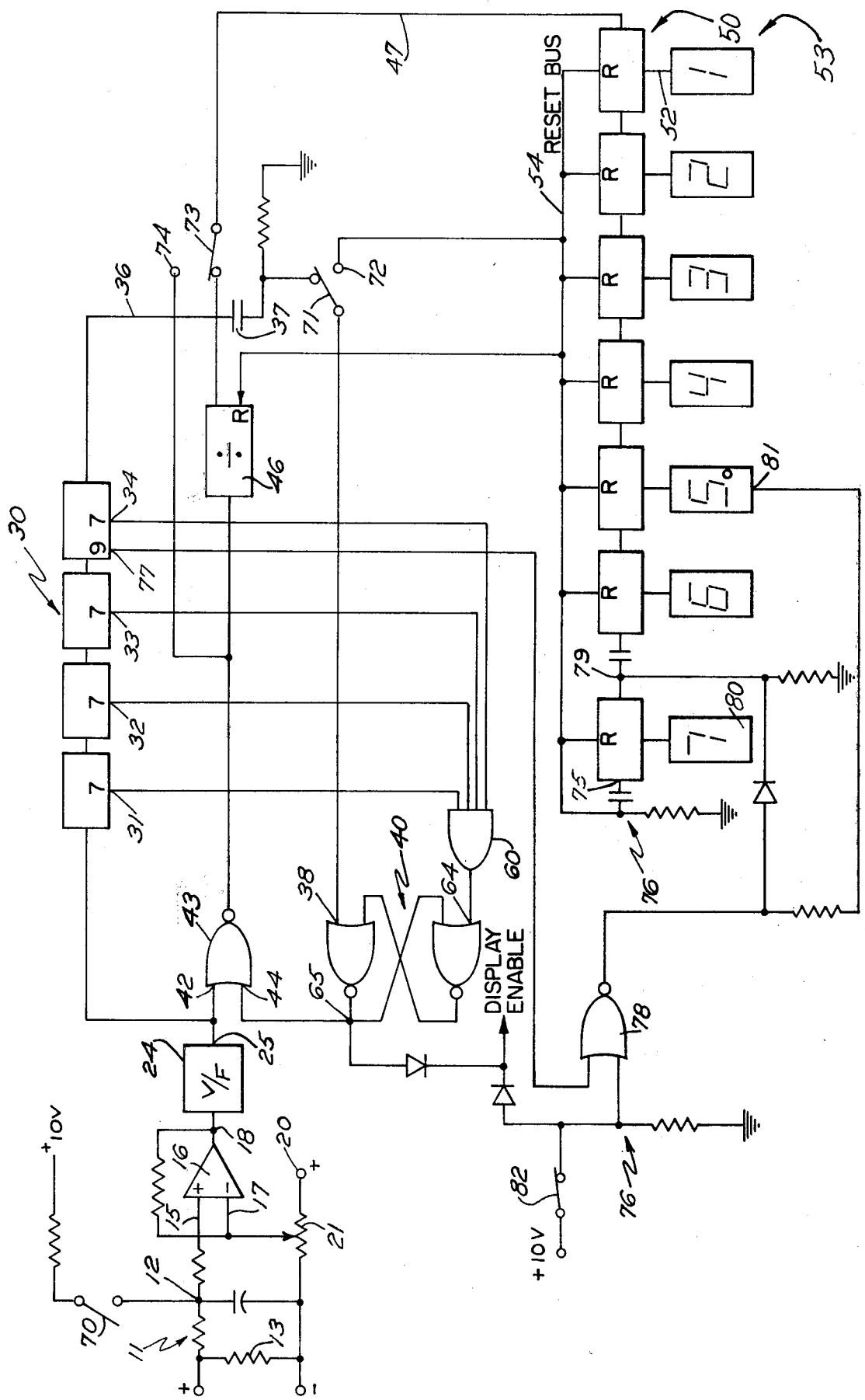

TOTALIZER

BACKGROUND OF THE INVENTION

Historically, totalizers for process measuring have been mechanical devices in which variables work on a mechanical integrator to provide an output that was usually read on a mechanical counter. A typical meter of this type is shown in U.S. Pat. No. 2,243,252. More recently, technology has offered integrating devices that display in digital form as, for example, in U.S. Pat. No. 3,014,659.

SUMMARY OF THE INVENTION

A totalizer circuit is provided which will act on a variety of input process signals that may be either a direct current signal or a direct voltage signal. The circuit is arranged so that the input signal is converted to a zero-based voltage signal as the first step thereof before application to a voltage to frequency converter. The output signal from the voltage to frequency converter is fed to a first decade counter with a decimal decoder and is also fed to a NOR gate. The decimal decoder function of the first decade is utilized as a scale factoring device which feeds an AND gate that, in turn, is coupled to a bistable multivibrator, the output of which is connected to the NOR gate so as to inhibit the same during a portion of a time period, depending on the scaling factor, so that only a preselected number of pulses are passed. The output of the NOR gate then feeds a frequency divider which, in turn, feeds a second series of decade counters with multisegment decoders, each decoder being coupled to a visual readout device.

DESCRIPTION OF THE DRAWINGS

The single FIGURE is a functional block diagram of the totalizer of the invention.

DESCRIPTION OF THE PREFERRED EMBODIMENT

Referring to the drawing, an input signal voltage is applied to the terminals marked "+" and "−" in the proper polarity, and in the circuitry shown is adapted for input of a current signal which is converted to a voltage signal in the input network generally designated 11. Should a voltage input be desired, then the voltage would be applied at point 12. The signal is then applied to an input 15 of an operational amplifier 16, and in order for the output of the amplifier 16 appearing at terminal 18 to vary from zero to some positive value for the range of process input signal that is found at the input, a subtraction device is utilized by having a voltage at terminal 20 appearing across a potentiometer 21 which will then place on the second input of amplifier 16 at 17 a subtraction voltage so that in effect the voltage appearing at terminal 15 has subtracted therefrom the voltage appearing at terminal 17 which will be selected depending upon the input signal. At a positive value (0 – 10V) which is fed into a voltage to frequency converter 24 there will be a frequency output consisting of a series of pulses, whose pulse repetition rate effectively varies from zero to $10kH_z$. The output of this voltage frequency converter, which is in effect a variable frequency oscillator, appears at terminal 25 is then fed to a first decade set of counters 30. These are preferably of the Johnson decade counter configuration each of which is provided with a decimal decoder gating, one of the ten decoded decimal output terminals being indicated as schematically at 31, 32, 33 and 34. The output of the last decade counter appearing on lead 36 is fed through a capacitor 37 of a differentiating network to an input 38 of a bistable multivibrator generally designated 40 which can be considered a memory device encompassing logic.

The same output from terminal 25 of the voltage to frequency converter 24 is also fed to input 42 of a NOR gate 43. Also the output of the bistable multivibrator 40 is fed to a second input 44 of the NOR gate 43, and the output of the NOR gate 43 feeds a divider 46 which, in turn, over lead 47 feeds a second COS/MOS decade counter series with multisegment decoders, which second decade counter series is generally designated by the reference numeral 50. As well known to those skilled in the art, this type of decade counter may be a five-stage Johnson decade counter and output decoder that converts the Johnson code into a seven-segment decoded output and will have a plurality of decoder leads which are generally indicated by the line 52 that will drive each stage of a suitable visual numerical display device indicated at 53, for example, which repeats itself for each of the display units that is desired to be made part of the circuit, there being a seven-digit readout illustrated purely by way of example.

Referring to the first decade counter, the decimal decoder outputs 31, 32, 33, and 34 provide a means for effectively introducing a scale factor into the totalizer circuitry. To this end the outputs of the decimal decoders may be set for a particular scale factor as, for example, 0.7777 and the leads 31, 32, 33 and 34 will be connected to terminal 7 of each of the decades. Therefore the outputs of these decimal decoders are fed to an AND gate 60 that thence goes to input terminal 64 of the bistable multivibrator 40.

To understand how this particular scaling circuit operates, let us assume that the output of the converter 24 at any one given time is 10,000 pulses, and while all of these pulses will be fed to the first decade counter 30, it is desired that only 7,777 pulses pass thru the NOR gate 43, which is 0.7777 ($10^4$). Accordingly, when each of the decimal decodes has an output signal at the leads 31, 32, 33 and 34, this will activate the AND gate 60, and an END pulse or a "1" signal in logic terms, will appear at input terminal 64 of the bistable multivibrator 40. This then causes the multivibrator to "flip" and the output at terminal 65 of the multivibrator 40 to go to 1 from its previous condition of zero, and the gate 43 will close or be inhibited. Thus, only 7,777 pulses are passed through the NOR gate 43 to the divider 46. The bistable multivibrator is reset by the 10,000th pulse appearing thru the decade counter 30 which is fed to input 38 from the output of the decade counter chain 30, and the process continues and 7,777 pulses are again counted, with the NOR gate 43 being opened since terminal point 65 of the bistable multivibrator 40 is at zero.

The divider 46 is a convenient device to make it possible to visually display a reasonable number on the totalizer readout and to smooth the pulse bursts. It may have any significant value, as for example, $2^{14}$, and in this way effectively the scaled down number of pulses 7,777 is divided by this particular factor and fed onto the second decade counter 50 which has a multisegment decoder therein to properly activate the visual displays 53.

Self-Testing

The totalizer of this invention has the ability to verify that it is operating correctly in a relatively simple manner. To this end, there is provided a switch 70 that may be closed which will apply a 100% input signal at terminal 12. This then produces at terminal 18 a corresponding full output signal which is then converted in the voltage frequency converter 24 so that at terminal 25 there is approximately a $10kH_z$ signal. This is then fed to the decade counters 30 which each divide the signal down by a factor of 10, and it will be readily understood an output will be displayed as if the device is totalizing a regular signal input.

In addition, the apparatus has the ability of operating in what could be called a self-test mode, and in this mode the scaling factor taken directly from NOR gate 43, is fed to the decimal counters 30 and will be displayed on four displays 53, and to indicate to the user that this is the figure that is being displayed, a decimal point in one of the display devices (the fifth one in the drawing) will blink. This is accomplished since in the example given, 7777 pulses pass thru NOR gate 43, AND gate 60 and multivibrator 40 operating in the normal fashion. To accomplish this, switch 82 is opened, switch 70 is closed, switch 71 is moved over into contact with contact point 72 and switch 73 is moved over into contact with terminal 74. As the most significant digit increments from 9 to 0 in decade counter 50, a digital "1" is present at its clock output terminal 75. It is then differentiated by the differentiating network indicated generally at 76 and resets all the displays to zero and through switch 71 resets the bi-stable multivibrator 40 at terminal 38. It will be noted that the output of NOR gate 43, instead of being fed to the divider 46, now passes directly into the first of the second decade counters 50. Also the first divider chain 30, which is effectively a division chain of $10^4$, maintains its counting as before from pulses at 25. A connection at 77 is mated to the decoded decimal output 9 of the last counter, and this is fed to NOR gate 78, which has been enabled by opening switch 82, where the pulse is inverted and fed into the input of the last of the second decade counters 50 as at 79. Also the signal is fed to decimal input 81 to provide blinking at approximately 1 $H_z$ with a $10kH_z$ signal at 25. Since the input of any one of the decade counters requires a positive transitional pulse to increment it as the decoded 9 at terminal 77 drops from a 1 to a zero, this input at 79 effectively inverts the logic so that a zero is rising to a 1 at its output. The rise of zero to 1 at the input 79 coincides with a rise from zero to 1 of the clock output at 75. This effectively provides a positive transition of each $10^4$ pulse through an inverting gate in coincidence with a clock output from the last of the first set of decades 30. Effectively, therefore, as each $10^4$ pulse is fed into terminal 79, it increments one state displaying the state on the display as display 80. This allows the whole display 53 to show the factor for approximately 10 seconds after it is counted into the four least significant digits, but without the additional dividing taking place by the last of the dividers the display would only show the factor for a very short period of time.

Suitable COS/MOS integrated circuits to work with the present invention would include the RCA CD4026A or equal for units "50", the RCA CD4017A or equal for units "30", the RCA CD4020A or equal 14-stage binary counter for "46", an RCA CD4001A or equal NOR gate interconnected as a multivibrator, and two NAND gates to form one AND gate, for example using both portions of an RCA CD4011A.

I claim:

1. A totalizer adapted to accept a process signal input and produce a totalized readout comprising first means for converting an input signal to a voltage signal proportional to the value of the input, second means converting said voltage signal to a series of pulses whose repetition rate is proportional to the signal input, a second multiple stage decade counter/divider responsive to the pulses, said counter/divider having decoded display outputs, a numerical display, said display coupled to the display outputs, means for introducing a scaling factor into the pulses, said means comprising a controllable gate connecting the second means to the second counter for passing a predetermined quantity of pulses over a chosen period, a first multiple stage counter with decoder terminals, a memory logic device, an AND gate coupled to the decoder terminals of the first counter, said AND gate also coupled to the memory device to reset the memory device which is coupled to the controllable gate to close the gate, and means to open the gate and reset the memory device after a full count by said first counter.

2. A totalizer as in claim 1 including a NOR gate and wherein the first and second counters are enabled for testing by applying to the input a full scaling voltage, the output of the controllable gate being fed directly to the input of the second counter, the display indicating the scaling factor, the output of the second decade counter being coupled to said NOR gate, said NOR gate being coupled to the controllable gate to reset it and means delaying the operation of the NOR gate to hold the display for a finite time.

3. A totalizer as in claim 2 wherein the means delaying the operation of the NOR gate comprises an additional decade counter stage of the second counter.

4. A totalizer adapted to accept a process signal input and produce a totalized readout comprising first means for converting an input signal to a voltage signal proportional to the value of the input, second means converting the voltage signal to a series of pulses whose repetition rate is proportional to said voltage signal, a first decade counter with a decimal decoder having an input and an output, and decimal decoder terminals, a NOR gate, the output of the second means being coupled to said decade counter and to an input of the NOR gate, a bistable multivibrator with two inputs, the output of the multivibrator being coupled to another input of the NOR gate, the output of the first decade counter coupled to a first input of the multivibrator, an AND gate, the input of said AND gate being coupled to the terminals of the decimal decoder of said first decade counter, the output of said AND gate being fed to a second input terminal of said bistable multivibrator whereby scaling factors may be introduced by inhibiting the NOR gate, a second multiple stage decade counter bank with multisegment decoders, the output of said NOR gate feeding said second decade counter bank, said multisegment decoders of said second decade counter bank coupled to visual readout devices whereby a totalized readout of said process signal with a scaling factor may be displayed.

\* \* \* \* \*